United States Patent
Pellizzer et al.

(10) Patent No.: US 11,139,023 B1
(45) Date of Patent: Oct. 5, 2021

(54) MEMORY OPERATION WITH DOUBLE-SIDED ASYMMETRIC DECODERS

(71) Applicant: Micron Technology, Inc., Boise, ID (US)

(72) Inventors: Fabio Pellizzer, Boise, ID (US); Nevil N. Gajera, Boise, ID (US); John Frederic Schreck, Lucas, TX (US)

(73) Assignee: Micron Technologhy, Inc., Boise, ID (US)

( * ) Notice: Subject to any disclaimer, the term of this patent is extended or adjusted under 35 U.S.C. 154(b) by 0 days.

(21) Appl. No.: 16/824,104

(22) Filed: Mar. 19, 2020

(51) Int. Cl.
*G11C 13/00* (2006.01)

(52) U.S. Cl.
CPC ........ *G11C 13/0026* (2013.01); *G11C 13/003* (2013.01); *G11C 13/0004* (2013.01); *G11C 13/0028* (2013.01)

(58) Field of Classification Search
CPC .............. G11C 13/0026; G11C 13/003; G11C 13/0028; G11C 13/0004
See application file for complete search history.

(56) References Cited

U.S. PATENT DOCUMENTS

| | | | | |
|---|---|---|---|---|
| 5,815,458 A * | 9/1998 | Chevallier | ............. | G11C 16/08 365/189.16 |
| 7,940,554 B2 * | 5/2011 | Scheuerlein | ............. | G11C 8/10 365/163 |
| 8,391,097 B2 * | 3/2013 | Chan | ....................... | G11C 16/30 365/230.06 |
| 9,627,052 B1 * | 4/2017 | Pellizzer | ............ | G11C 13/0026 |
| 9,691,478 B1 | 6/2017 | Lin et al. | | |
| 9,870,820 B2 * | 1/2018 | Pellizzer | ............ | G11C 13/0033 |
| 10,153,040 B2 * | 12/2018 | Pellizzer | ............ | G11C 13/0004 |
| 10,410,718 B2 * | 9/2019 | Pellizzer | ............ | G11C 13/0004 |
| 2009/0034313 A1 * | 2/2009 | Jang | ........................ | G11C 5/063 365/51 |
| 2010/0054032 A1 * | 3/2010 | De Sandre | ............... | G11C 8/10 365/163 |
| 2010/0238709 A1 * | 9/2010 | Eun | .......................... | G11C 8/10 365/148 |
| 2011/0239062 A1 | 9/2011 | Noda | | |
| 2012/0044733 A1 * | 2/2012 | Scheuerlein | ....... | G11C 13/0004 365/51 |
| 2015/0179253 A1 * | 6/2015 | Tang | ................... | G11C 13/0069 365/148 |
| 2017/0200497 A1 * | 7/2017 | Pellizzer | ............ | G11C 13/0028 |
| 2019/0198110 A1 | 6/2019 | Ji et al. | | |
| 2019/0267061 A1 | 8/2019 | Kim | | |

OTHER PUBLICATIONS

International Search Report and Written Opinion for PCT Application No. PCT/US2021/017980 dated Jun. 4, 2021 (11 pages).

* cited by examiner

*Primary Examiner* — Khamdan N. Alrobaie
(74) *Attorney, Agent, or Firm* — Fletcher Yoder, P.C.

(57) ABSTRACT

As described, an apparatus may include a memory cell corresponding to a memory address and an access line forming at least a portion of the memory cell. The apparatus may include a first decoder associated with a first delivery driver coupled to a first end of the access line and a second decoder associated with a second delivery driver coupled to another end of the access line.

20 Claims, 9 Drawing Sheets

MEMORY OPERATION WITH DOUBLE-SIDED ASYMMETRIC DECODERS

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through decoding circuitry (e.g., decoders). In a standard "quilt" architecture, decoders may couple to one side of the wordlines or one side of the bitlines. This design may create at least two classes of memory cells (e.g., memory cells relatively near to the decoders and memory cells relatively farther from the decoders). Memory cells disposed relatively closer to the decoders may suffer from capacitive spikes when selected, such as may be a result from a low resistance path to the decoders. However, memory cells disposed relatively farther from the decoders may suffer from low current delivery amplitudes during programming, such as may be a result from a high resistance path to the decoders. An approach that improves selection signal delivery to the memory cells (e.g., improves a uniformity of selection signal amplitudes transmitted to the memory cells) may be desired.

BRIEF DESCRIPTION OF THE DRAWINGS

Various aspects of this disclosure may be better understood upon reading the following detailed description and upon reference to the drawings in which.

DETAILED DESCRIPTION

Figure 1:
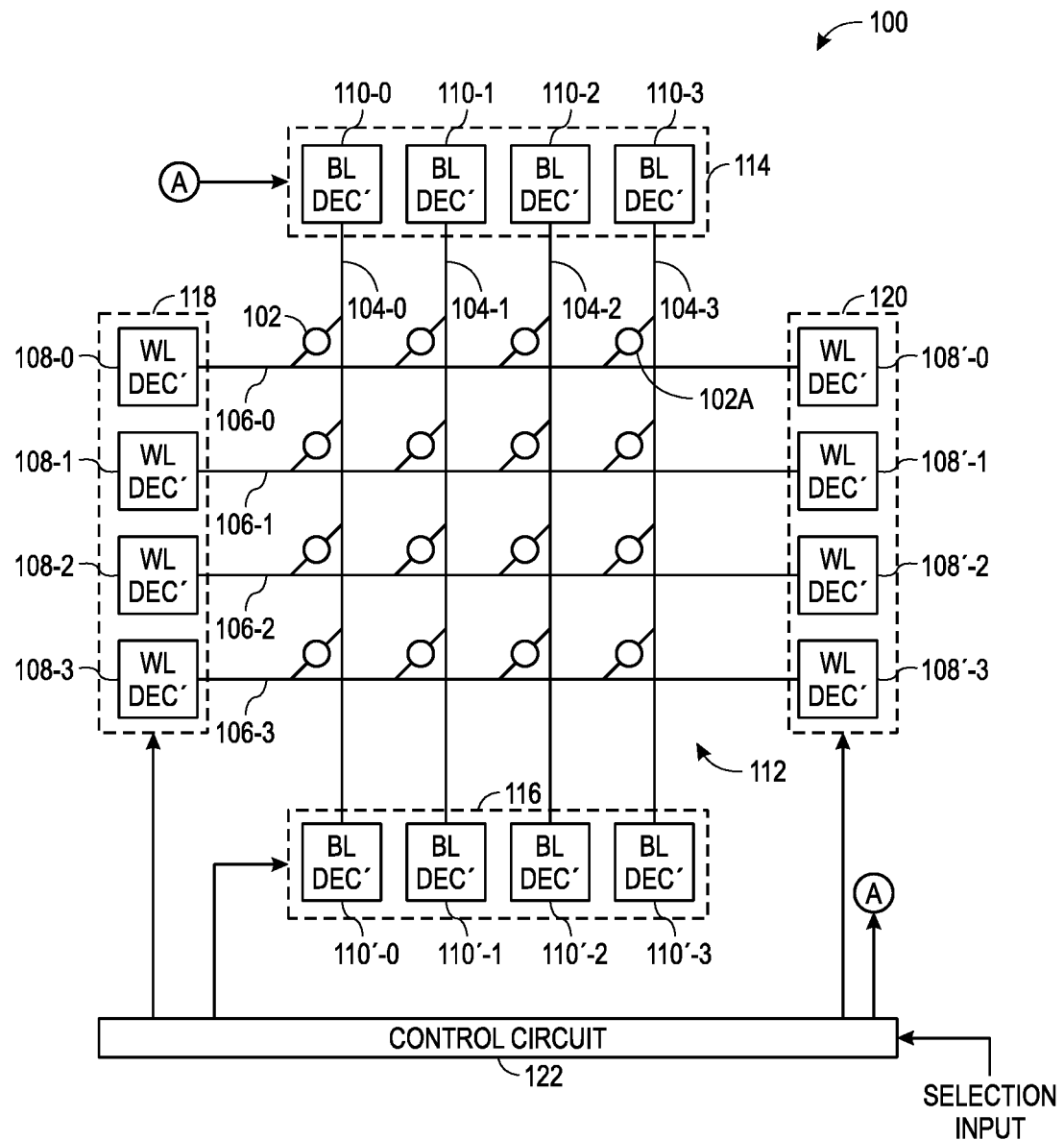
FIG. 1 is a block diagram of a portion of a memory, in accordance with an embodiment.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells with each memory cell coupled to at least two access lines. For example, a memory cell may be coupled to a bitline and a wordline. As such, each access line may be coupled to a large number of memory cells. To select a memory cell, a decoder circuit associated with a first access line for the memory cell and a decoder circuit associated with a second access line for the memory cell may both provide a voltage and/or a current on the respective access lines. By applying voltages and/or currents to the respective access lines, the memory cell may be accessed, such as to write data to the memory cell and/or read data from the memory cell.

Since each access line may be coupled to a larger number of memory cells, each memory cell may be a different physical distance from respective decoder circuits of the access lines. Further, since distances between memory cells and a selection signal source may be different, a parasitic load associated with each memory cell may vary based on the distances. The parasitic load may include a resistance of the metal traces used to form the access lines, and parasitic capacitances associated with both the metal traces and the associated decoder circuits. As such, each memory cell may have a different associated parasitic load due to their respective decoder circuitries. Parasitic loads associated with each memory cell may affect the voltages and/or currents (e.g., selection signals) each memory cell receives when the respective decoder circuits provide the voltages and/or currents to the access lines. That is, while a voltage provided to an access line by a decoder circuit of the access line may be the same for each memory cell associated with the access line, the voltage and timing of the voltage received by a particular memory cell may differ from other memory cells along the same access line due to its specific location along the access line with respect to the decoder circuit, such as a physical distance between the decoder circuit and the memory cell.

Keeping the foregoing in mind, when providing selection signals to memory cells, greater voltages and/or currents may be used to compensate for any parasitic loads affecting memory cells disposed at an end of an access line. This may lead to a current spike and/or voltage spike (e.g., voltage or current that is greater than a threshold amount of voltage or current) being delivered to memory cells disposed closer to the decoder. Thus, it may be desired to improve a design of a memory cell array to improve delivery of selection signals (e.g., a likelihood and/or occurrence of current spikes and/or voltage spikes is reduced).

An architecture of the memory device may leverage bipolar decoders. Bipolar decoders may be able to provide both positive and negative selection signals to memory cells. Furthermore, these bipolar decoders may be coupled to each side of the access lines (e.g., both ends of bitlines, both ends of wordlines) such that a distance that a furthest memory cell is from its closest decoder is reduced in half since, for example, a memory cell previously at an end of an access line is now coupled to a decoder. When bipolar decoders are coupled to either end of an access line, the bipolar decoder coupled in this configuration may be referred to as a double-sided bipolar decoder (e.g., double-sided decoder) since the bipolar decoder is coupled to both ends of the access line. Using double-sided decoders may reduce a distance that a furthest memory cell is from its corresponding decoder since the previously disconnected end of the access line is now able to be coupled to a double-sided decoder. Double-sided decoders may enable driving the access lines from both ends of the access lines. For memory devices that include multiple decks of memory cells, it is noted that double-sided decoders may be used for each respective deck.

In some cases, different decoding circuitry may be used on either ends of the access lines. For example, spike mitigation drivers may couple at both ends of a respective access line while select drivers may be coupled to one end of a respective access line and/or current delivery drivers, when different from spike mitigation drivers, may be coupled to one or both ends of a respective driver line. Specific coupling examples are discussed herein, however it should be understood that other configurations are enabled from this disclosure. For example, double-sided decoders may be compatible with memory devices that use any number of memory cells and have any number of memory decks, regardless of the number of each depicted and discussed herein.

By using double-sided decoders, current spikes and/or voltage spikes delivered to memory cells relatively closer to the decoding circuitry may be reduced while driving of memory cells farther from the decoding circuitry may still be possible. Furthermore, inclusion of double-sided drivers may improve current delivery on the previously far class of cells, such as by reducing by $2x$ (e.g., two times) a duration of time used to deliver selection signals to the memory cells. In some cases, the double-sided drivers may enable a reduction in circuitry used in edge terminations, and thus further improve memory circuitry by simplifying circuit designs.

Keeping the foregoing introduction in mind, FIG. 1 is a block diagram of a portion of a memory 100. The memory 100 may be any suitable form of memory, such as non-volatile memory (e.g., a cross-point memory) and/or volatile memory. The memory 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). When memory cells 102 have a single material that functions as a selector and storage element, these architectures may leverage single material (e.g., chalcogenide) process architectures and may have respective values set within each memory cell by leveraging positive signals (e.g., positive voltages, positive currents) to set a logic high value in the memory cell and by leveraging negative signals or lower voltage signals (e.g., negative voltages, negative currents) to clear a logic high value or set a logic low value in the memory cell. Single material process architectures may use bipolar decoders (e.g., driving circuitry) to access the memory cell during a memory operation. In some cases, unipolar decoders may be used, such as when a neutral mid-point between a positive signal level and a negative signal level is shifted to equal half a voltage difference between the bitlines 104 and wordlines 106.

For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell.

The bitline decoders 110 may be organized in multiple groups of decoders. For example, the memory 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104). For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

To reduce or eliminate the occurrence of a current spike when selecting and/or accessing a target memory cell, thereby improving operation of the memory 100, a distinction may be made between selection drivers and delivery drivers when operating the memory 100. For example, when targeting a memory cell 102A, the memory 100 may activate decoders furthest from the targeted memory cell 102A before activating decoders nearest to the targeted memory cell 102A. To select the targeted memory cell 102A for use in a memory operation, signals may be transmitted from selection drivers of the decoders before signals are transmitted from delivery drivers of the decoders, as discussed in further detail with respect to FIGS. 6-8. This may deliver a maximum current from the delivery drivers after a time of snap-back of the targeted memory (e.g., memory cells 102 snap-back thus temporarily being characterized by a negative resistance), enabling any current spike associated with the delivery of the selection signals to the targeted memory cell 102A to be contained and/or mitigated by decoders of the memory 100.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. As such, a parasitic load associated with each of the memory cells 102 may be different with respect to each of the wordline decoders 108 and/or bitline decoders 110 due at least in part to differences in physical distance between the memory cells 102 and each of the associated decoding circuitry. It is noted that the depicted components of the memory 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

These parasitics may affect driving of the decoding circuitry when accessing memory cells 102 since accessing (e.g., thresholding) a target of the memory cells 102 may include supplying voltages and/or currents to a targeted memory cell, such as the memory cell 102A. Inconsistent parasitic loads and/or transmission path resistances between memory cells 102 may make driving selection of memory cells 102 difficult since signals received by a relatively near memory cell may be larger than signals received by a relatively far memory cell. Thus, relatively larger signals may be used when accessing memory cells 102 so that even memory cells 102 far from the decoders may be accessed when these signals are provided to adjust a voltage across the targeted memory cell (e.g., memory cell 102A) to increase above a threshold voltage.

For example, a ground reference voltage may be provided on the bitline 104-3 while a positive voltage is provided on a wordline 106-0, such that a voltage difference between ground and the positive voltage is greater than the threshold voltage. However, when distances between memory cells 102 cause resistance of transmission paths (e.g., a particular length of a bitline and/or of a wordline) taken by the signals to be inconsistent between memory cells 102, some of the resulting transmitted voltage signals and/or current signals provided to each of the memory cells 102 may vary based on resistances of the transmission path used to transmit the signals.

The memory 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. The control circuit 122 receives control signals (e.g., selection inputs) that may determine which of the respective pairs of bitline decoders 110 and/or of the wordline decoders 108 to activate first. The control signals may be based on which of the pairs of bitline decoders 110 and the wordline decoders 108 are physically farther and/or closer to the target of the memory cells 102. The relative physical distance from the decoder circuits to the target memory cell may be based on a memory address of the memory cell. An order in which the decoder circuits are activated may be determined by various other logic (not shown) of the memory 100, such as control logic that receives address information.

After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage, or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity to the memory cells 102 (e.g., in particular, writing to select/storage material (SD) of the memory cell) and reading the memory cells 102 (e.g., in particular, reading a threshold voltage of the memory cell) using a signal with a given (e.g., known) fixed polarity.

In some cases, to access a target memory cell 102A, a respective of the bitline decoders 110 and of the wordline decoders 108 farther from the target memory cell 102A may be activated by the control circuit 122. For example, the bitline decoder and the wordline decoder furthest from the target memory cell 102A (e.g., bitline decoder 110-0 and wordline decoder 108-3) may provide a voltage through a transmission path characterized by a larger parasitic load (e.g., having a higher resistance) due to the greater physical distance between the target memory cell 102A and the bitline decoder 110-0 or the wordline decoder 108-3. A transmission path characterized by a larger parasitic load and/or resistance may reduce current spikes generated when accessing the target memory cell 102A. Additionally or alternatively, after the target memory cell 102A is selected, the control circuit 122 may operate to activate the bitline decoder and the wordline decoder closest to the target memory cell 102A to cause a delivery of a current to the target memory cell 102A. The current may be a maximum current able to be provided by the decoders and/or associated with a given (e.g., known) fixed polarity used to read or write to the SD material of the target memory cell 102A. Delivery of the current from the second decoder may occur after a snap-back of the memory cell 102A.

Figure 2:
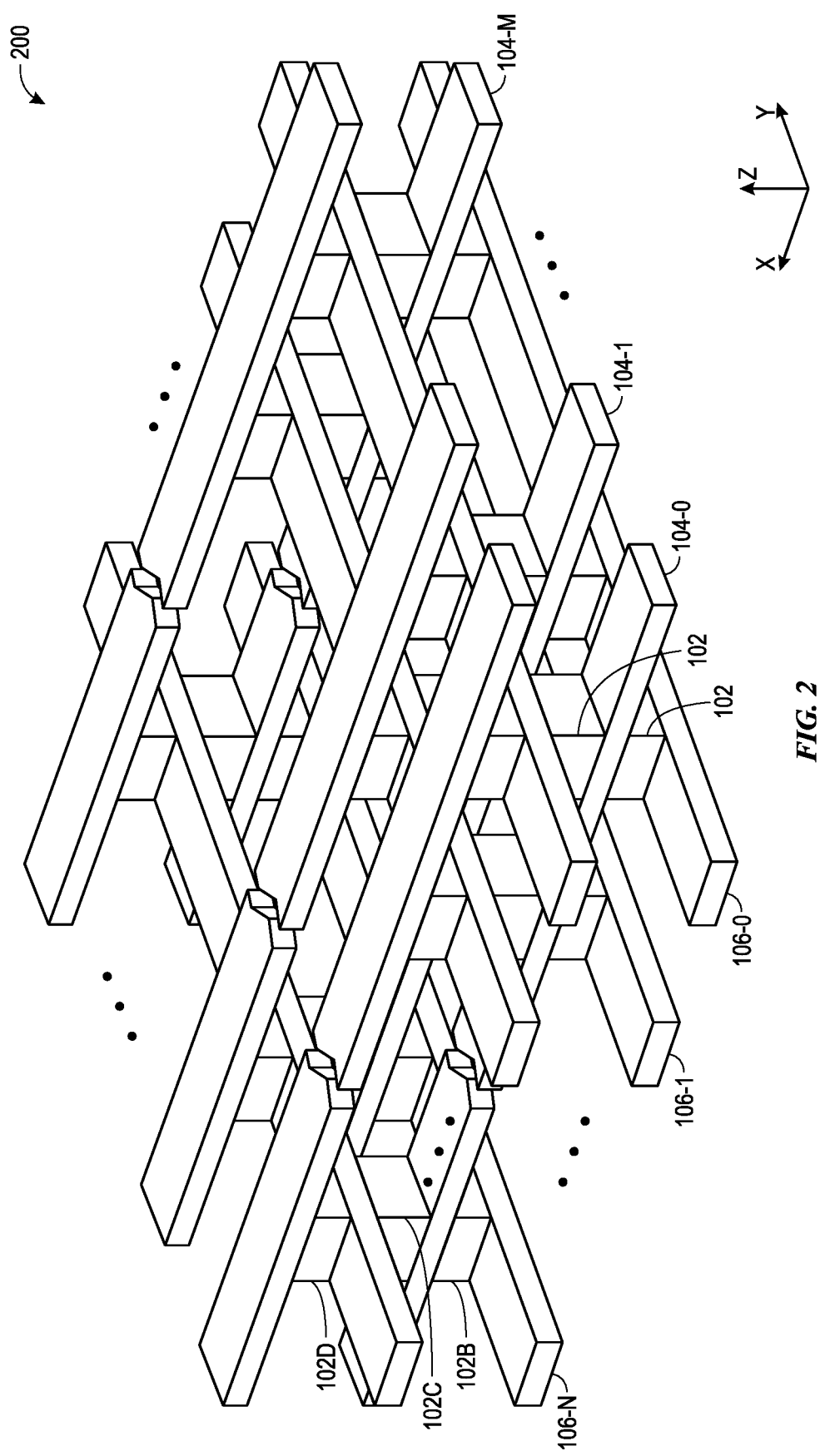
FIG. 2 is a diagram of the portion of the memory of FIG. 1, in accordance with an embodiment.

FIG. 2 is a diagram illustrating a portion of a memory array 200 in accordance with an embodiment of the present disclosure. The memory array 200 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular of the wordlines 106 and the bitlines 104 serving as the electrodes for a particular of the memory cells 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a select/ storage material (SD)) and/or a material layer that functionally replaces a separate memory element layer and selector element layer. The selector element (e.g., SD material) may be disposed between a wordline contact and a bitline contact associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104 corresponding to the respective memory cells 102 in response to a particular voltage applied to the selected of the wordlines 106 forming the respective memory cells 102.

As illustrated, the memory array 200 may be arranged in a cross-point memory array architecture (e.g., a three-dimensional (3D) cross-point memory array architecture) that extends in any direction (e.g., x-axis, y-axis, z-axis). The multi-deck cross-point memory array 200 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 200 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 200 may include more or less bitlines 104, wordlines 106, and/or memory cells 102 than shown in the examples of FIG. 2.

Figure 3:
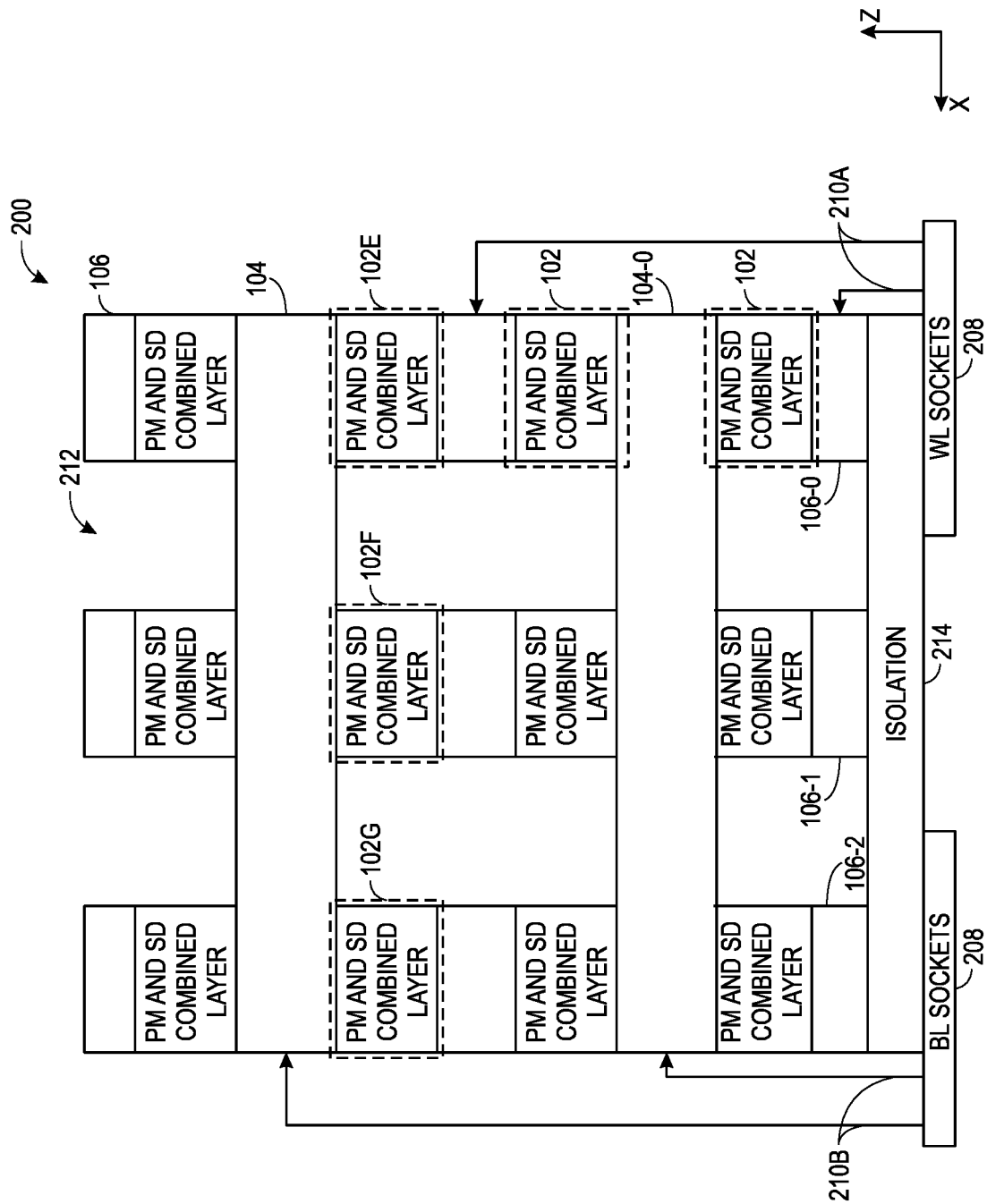
FIG. 3 is a side-view of a memory array of FIG. 2, in accordance with an embodiment.

FIG. 3 is a side-view of a diagram illustrating the portion of the memory array 200 of FIG. 2. In particular, the memory array 200 of FIG. 3 includes the wordlines 106, the bitlines 104, and the memory cells 102 discussed earlier. Each of the memory cells 102 may be disposed in a particular plane between a bitline and a wordline. The levels of planes may be referred to as "decks," and thus the depicted example includes the memory cells 102E, 102F, and 102G disposed in a same deck and includes four decks of memory cells 102 in total. Each of the memory cells 102 may include phase-change material (PM) and select/storage material (SD). It is noted that in some memory arrays 200, the PM and the SD may be combined or functionally provided by one material layer, as opposed to two material layers (e.g., PM and SD disposed one above the other in separately deposited layers). In this way, some memory arrays 200 may be based on single material (e.g., chalcogenide) process architectures that reduce cross-contaminations between PM and SD layers.

The memory array 200 also may include sockets 208. Each socket 208 may include decoders coupled to each of the bitlines 104 and/or wordlines 106. The sockets 208 may be used when transmitting signals read from and/or written to (e.g., signals 210A, signals 210B) the memory cells 102 from other circuitry of the memory 100. It is noted that the arrows corresponding to the signals 210A and/or the signals 210B may generally represent communication between the wordlines 106 and/or the bitlines 104 and the decoders of the sockets 208. It is noted that negative space 212 depicted between the wordlines 106 and/or the bitlines 104 (and other circuitries of the memory array 200) may correspond to air or ambient atmosphere of the memory 100, however the negative space 212 may also be filled with insulating material and/or other suitable material for use in a computing device. It is noted that distances between the wordlines 106 and/or the bitlines 104 may be exaggerated for clarity and may be reduced in an actual implementation to reduce a volume of negative space 212 within the final manufactured product. It is also noted that an additional isolation material layer 214 may be disposed above the sockets 208 (e.g., between socket 208 layer and a first deck of wordlines 106 or bitlines 104).

Figure 4:
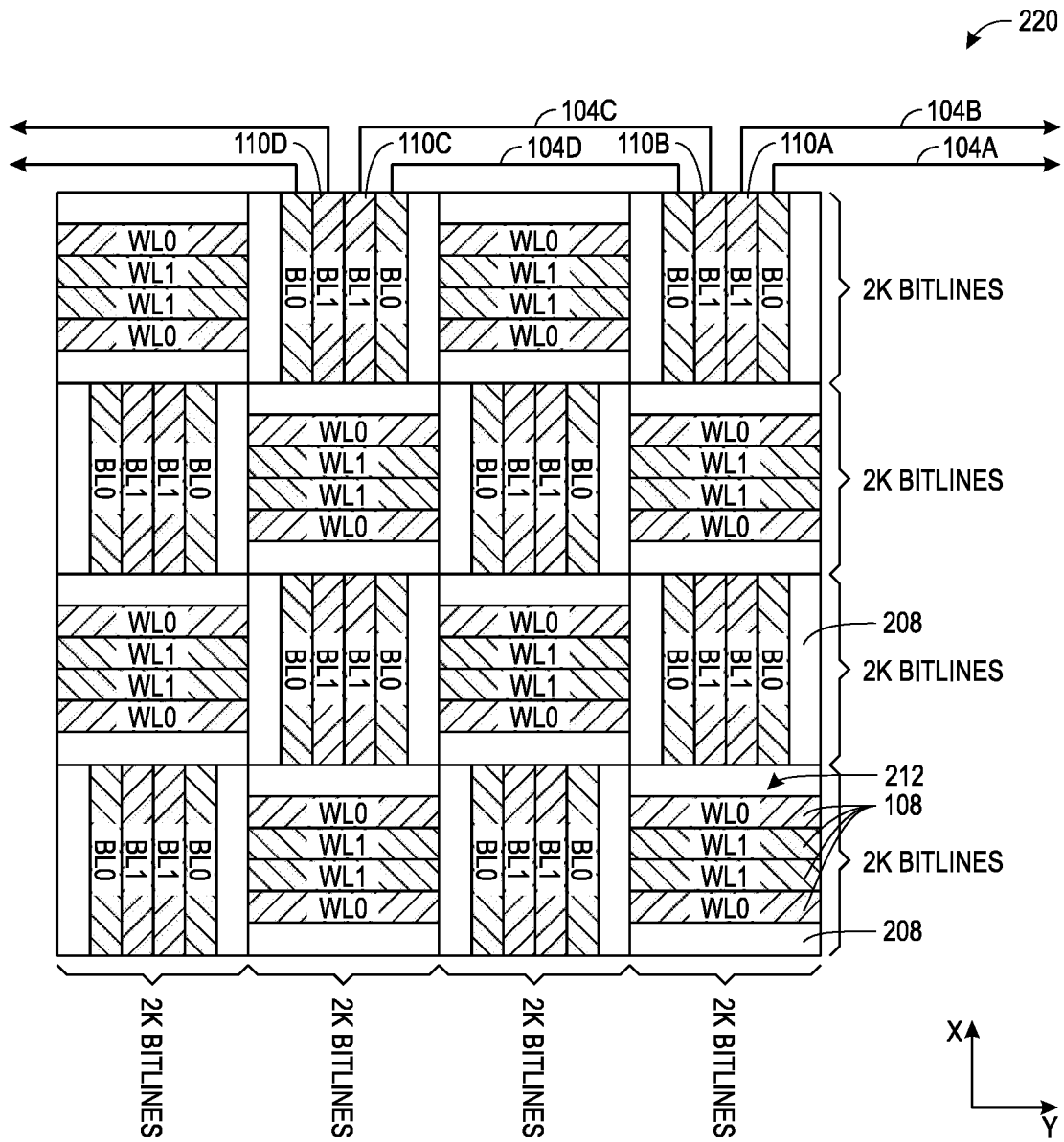
FIG. 4 is a plan-view of the memory array of FIG. 2 depicting dual terminating bitlines, in accordance with an embodiment.

FIG. 4 is a plan-view of decoding circuitry 220 associated with the memory array 200 of FIG. 3. Although depicted in one plane, it should be understood that some of the wordlines 106 and the bitlines 104 may be disposed on different planes (e.g., such as below or above each other as part of different decks). For example, the bitline 104A and the bitline 104B may be disposed in different planes as associated with different decks to select different levels of memory cells 102.

In the decoding circuitry 220, sockets 208 may include bitline decoders 110 and/or wordline decoders 108. Each of the bitline decoders 110 and/or the wordline decoders 108 may drive a particular number of bitlines 104 or wordlines 106. For example, in the depicted example, each of the bitline decoders 110 and/or the wordline decoders 108 respectively drive 2,000 wordlines 106 and/or 2,000 bitlines 104 (e.g., a subset of which is represented by bitlines 104A, 104B, 104C, 104D). It should be understood that any amount of wordlines 106 and/or bitlines 104 may be driven by suitably-sized decoding circuitry 220. The decoding circuitry 220 may be used to generate signals for transmission on bitlines 104. It is noted that decoding circuitry of FIG. 4 depicts decoding circuitry used to generate signals for transmission on wordlines 106. The signals transmitted via the wordlines 106 and bitlines 104 may be used to drive memory cells 102 found between intersections of the wordlines 106 and the bitlines 104. Indeed, each of the bitline decoders 110 may drive bitlines 104 that are disposed perpendicular to an orientation of the bitline decoders 110. In a similar way, each of the wordline decoders 108 may drive wordlines 106 disposed perpendicular to an orientation of the wordline decoders 108. In this way, and as depicted in FIG. 2, the wordlines 106 and bitlines 104 may intersect to form memory cells 102.

To elaborate, each socket 208 may use multiple decoders for each line (e.g., bitlines 104, wordlines 106). Separate decoding circuitry may be used for each deck of bitlines 104 and/or wordlines 106. In this way, four decks of bitline decoders 110 and wordline decoders 108 may be associated with the memory array 200. In some memory arrays, the bitline decoders 110 and wordline decoders 108 may each respectively correspond to one of the bitlines 104 and/or to one of the wordlines 106. However, due to differences in parasitic loads and/or resistances between decoders and memory cells 102 formed by intersections of the bitlines 104 and wordlines 106, driving each of the memory cells 102 may be unpredictable and/or inconsistent (e.g., voltage and/or current transmitted to each of the memory cells 102 changes based on location of memory cells). To reduce a likelihood of variance in signal delivery and/or to reduce an impact of parasitics on the driving of the memory cells 102, a respective one of the memory cells 102 may be driven using a combination of decoding circuitry shared between bitlines 104 and/or wordlines 106. In this way, each of the memory cells 102 may be driven using signals from both ends of bitlines 104 and/or wordlines 106, such that the memory cells 102 receive a portion of the selection (e.g., driving) signals from a first decoder and a portion of the selection (e.g., driving) signals from a second decoder via a same of the bitlines 104 or wordlines 106.

This sharing is represented in FIG. 4 by an example bitline 104C terminating first at the bitline decoder 110B and second at the bitline decoder 110C. The bitline decoder 110A, bitline decoder 110B, the bitline decoder 110C, and the bitline decoder 110D may be associated with the same deck. Since decoding circuitry (e.g., bitline decoders 110B, 110C) may access the bitline 104C from both sides of the respective bitline 104C, a maximum resistance at a center of the respective bitline 104C may correspond to parasitics equal to half a previous worst-case amount of parasitics for driving of the targeted memory cells associated with the bitline 104C (e.g., when compared to systems that do not drive bitlines 104 and/or wordlines 106 with dual termination access lines, such as systems that couple one side of a respective of the bitlines 104 and/or wordlines 106). In a similar way, the bitlines 104A, 104B, and 104D may couple to additional decoding circuitry such that each end of the bitlines 104 are electrically driven by decoding circuitry (e.g., bitline decoders 110).

Figure 5:
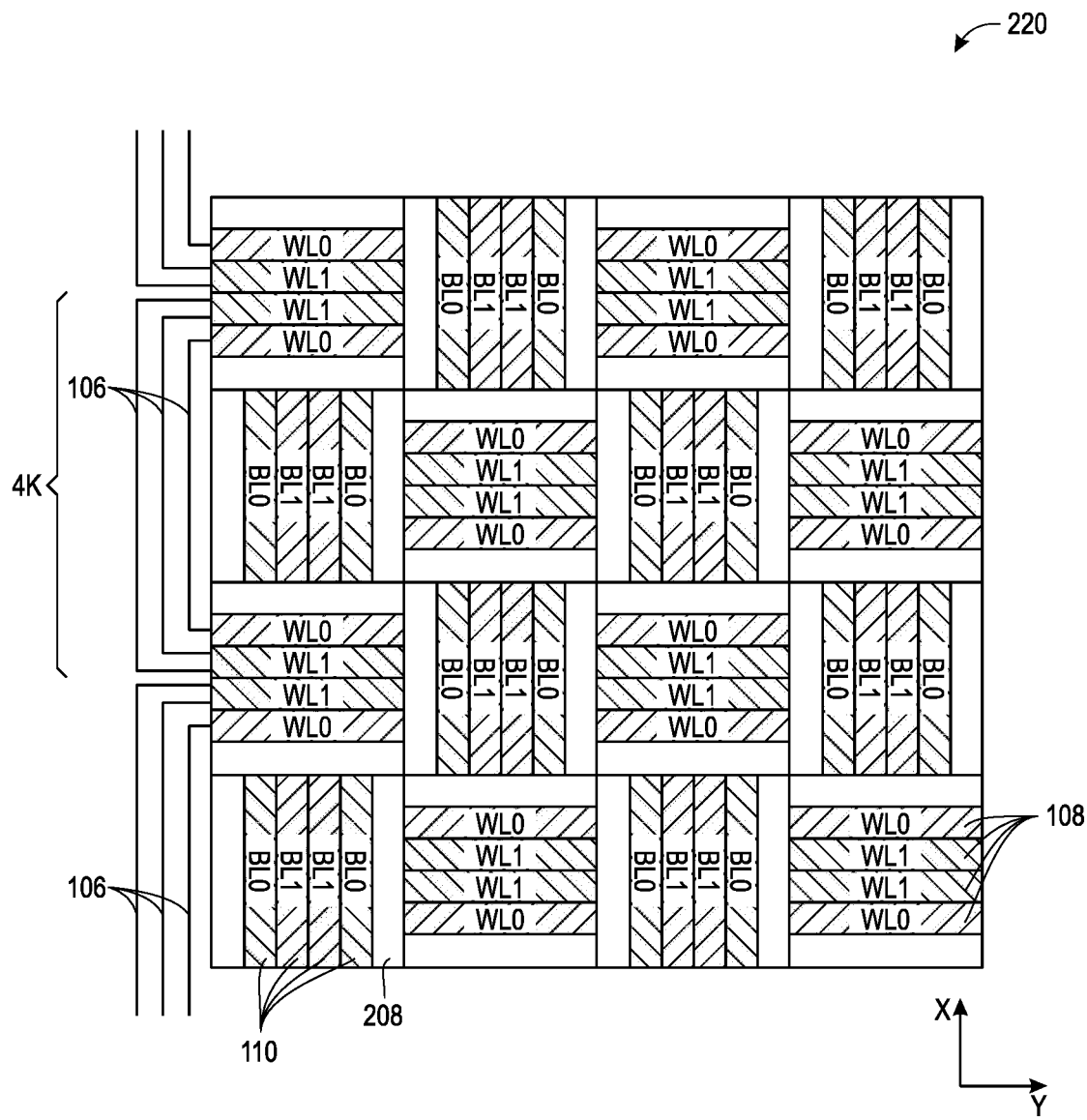
FIG. 5 is a plan-view of the memory array of FIG. 2 depicting dual terminating wordlines, in accordance with an embodiment.

To highlight how wordlines 106 may dual terminate at decoding circuitry, FIG. 5 is a plan-view of decoding circuitry 220 associated with the memory array 200 of FIG. 3. Although depicted in one plane, it should be understood that some of the wordlines 106 and the bitlines 104 may be disposed on different planes (e.g., such as below or above different decks). It is noted that each decoder 110, 108 for the different decks may be disposed in a same plane and/or on a same surface, on different planes and/or surfaces, or a combination of the two. The decoder circuitry 220 of FIG. 4 and the decoder circuitry 220 of FIG. 5 may be combined to allow dual decoder driving of each memory cell of the memory array 200.

Figure 6:
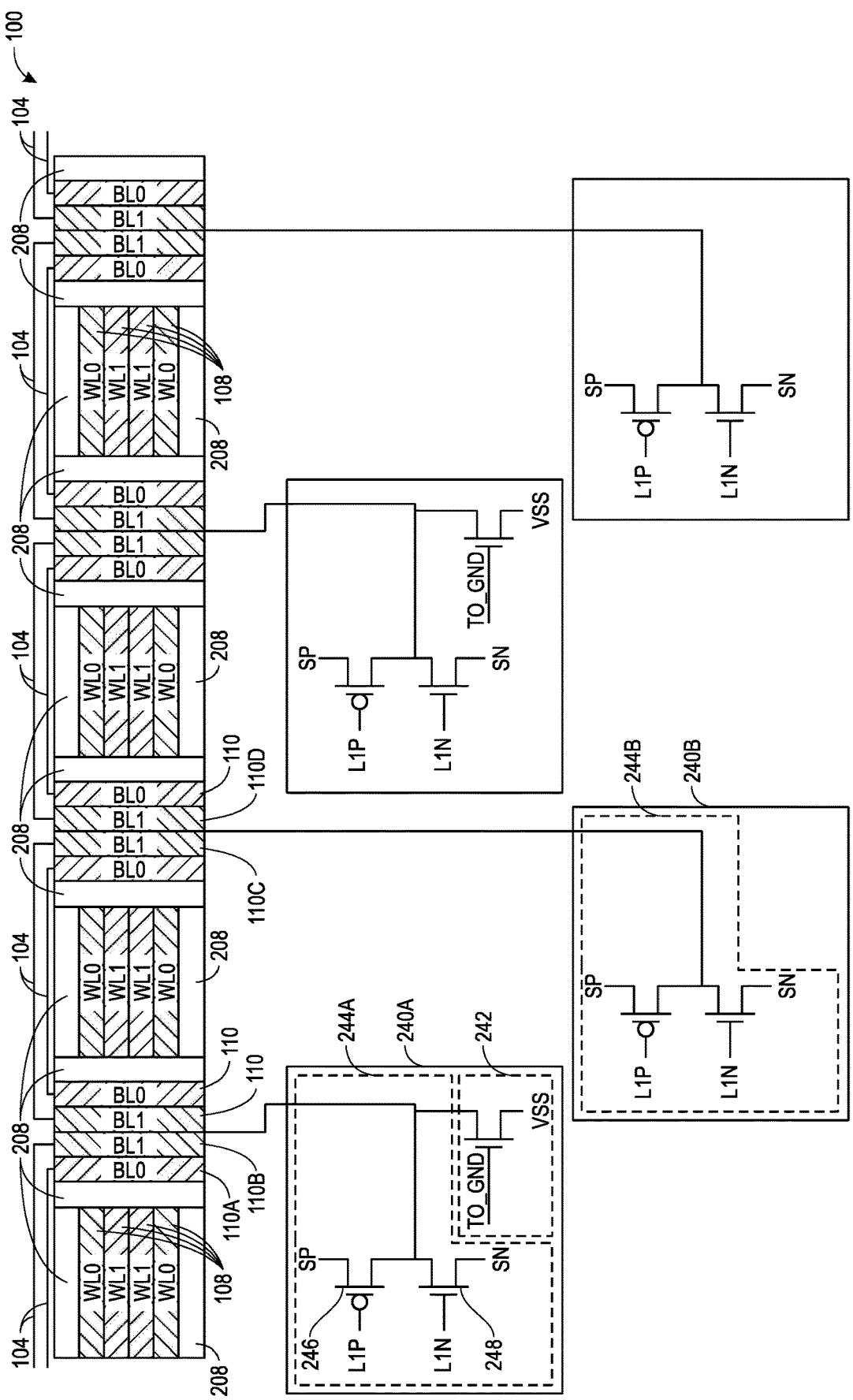
FIG. 6 is a diagram of driving circuitry used to drive signals via the dual terminating bitlines and/or wordlines of FIGS. 4 and 5, in accordance with an embodiment.

To elaborate further on decoding circuitry that may be used in conjunction with the dual termination access lines 104 and 106, FIG. 6 is an illustration of driving circuitry 240 associated with dual decoder driving discussed above. Some of the decoding circuitry 220 of FIG. 4 is depicted in FIG. 6. The driving circuitry 240 may be included within the decoding circuitry 220 (e.g., bitline decoders 110) and/or may be provided external to the decoding circuitry 220 and used to provide driving signals to the memory cells 102 via the bitlines 104. Since the bitlines 104 are dual terminated, signals generated by driving circuitry 240A may affect signals generated by driving circuitry 240B.

When the control circuit 122 of FIG. 6 selects a memory cell, the control circuit 122 may enable a deselection driver 242 of the driving circuitry 240A not included in the driving circuitry 240B. The deselection driver 242 may isolate application of driving signals from the driving circuitry 240A and the driving circuitry 240B to the portion of the memory array 112 associated with the selected memory cell.

For example, the deselection driver 242 may, when activated, keep its associated access line deselected since the activation of the deselection driver 242 couples the access line to ground voltage (e.g., VSS) and/or system logic low reference voltage. To disable the deselection driver 242, the control circuit 122 may apply a control signal (TO_GND) to the deselection driver 242 to cause the other driving circuitry to move a voltage of the selected line away from the ground voltage (VSS). The control circuit 122 may determine, such as based on a memory address of the selected memory cell, which of the delivery drivers 244 to activate based on which of the delivery driver 244A or delivery driver 244B is farther from the selected memory cell. While the deselection driver 242 is enabled, the control circuit 122 may activate the selected of the delivery drivers 244. After a duration of time passes, the selected memory cell may snap-back, causing selection signals to be transmitted to the selected memory cell via the corresponding of the bitlines 104 or wordlines 106. During a delivery phase (e.g., after the snap-back of the deselection driver 242 and/or selected memory cell), a maximum current is to be delivered to the selected memory cell. Thus, the control circuit 122 may activate the other of the delivery driver 244 (e.g., delivery driver 244 determined to be relatively nearest to the selected memory cell), such that both the delivery driver 244A and the delivery driver 244B are enabled and both apply a current to the selected memory cell. The value of current applied when the combination of the delivery driver 244A and the delivery driver 244B are activated may be of a suitable value to program the selected memory cell and/or to read the selected memory cell.

Since the driving circuitry 240 uses bipolar decoders (e.g., decoders that are able to generate one or more signals that are positive and/or negative), the control circuit 122 may activate either a pull-up operation (e.g., operation that generates a positive polarity output) that drives the decoders 110 with signals from a positive source (SP) or a pull-down operation (e.g., operation that generates a negative polarity output) that drives the decoders 110 with signals from a negative source (SN) of the selected driving circuitry 244 to cause a positive voltage or a negative voltage to be applied to the selected memory cell. In some cases, the negative source (SN) may couple to ground. The pull-up operation may include the control circuit 122 enabling a transistor 246 (e.g., by applying control signal L1P to the transistor 246) coupled to ground and a positive voltage supply, thereby causing a positive voltage to be applied to the selected memory cell. Similarly, the pull-down operation may include the control circuit 122 enabling a transistor 248 (e.g., by applying control signal L1N to the transistor 248) coupled to ground and a negative voltage supply, thereby causing a negative voltage to be applied to the selected memory cell. It is noted that this example shows the transistor 246 as a p-channel transistor and the transistor 248 as an n-channel transistor, it should be understood that any suitable transistor may be used as the transistor 246 and/or as the transistor 248. For example, the transistor 246 and/or the transistor 248 may each be a p-channel transistor and/or an n-channel transistor.

Figure 7:
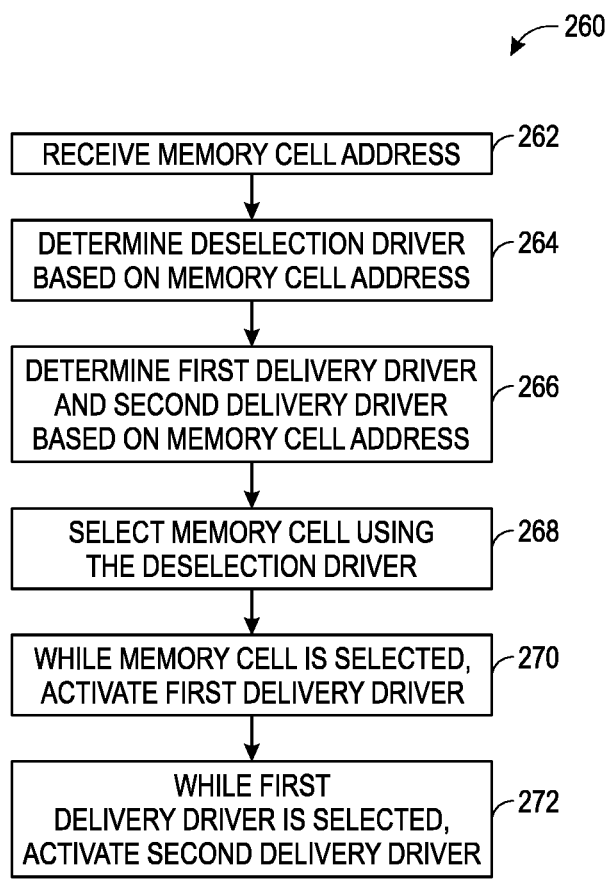
FIG. 7 is a flowchart of a process for selecting a memory cell from the memory array of FIG. 2 using the driving circuitry of FIG. 6, in accordance with an embodiment.

To elaborate, FIG. 7 is a flowchart of a process 260 for selecting the memory cell 102A from the memory cells 102. The control circuit 122 is described below as performing the process 260, but it should be understood that any suitable processing circuit may additionally or alternatively perform the process 260. Furthermore, although the process 260 is described below as being performed in a particular order, it should be understood that any suitable order may be used to perform individual operations of the process 260.

At block 262, the control circuit 122 may receive an address that targets the memory cell 102A from the memory cells 102. The address may be a logical address that is converted by the control circuit 122 into a physical address. The control circuit 122 may use the physical address to make certain control decisions. For example, at block 264, the control circuit 122 may use the physical address to determine which deselection driver 242 to use to select the memory cell 102A, and/or, at block 266, which delivery drivers 244 to use when selecting the memory cell 102A.

When, at block 264, the control circuit 122 determines the deselection driver 242, the control circuit 122 may identify which of the deselection drivers 242 corresponds to the memory cell 102A. The control circuit 122 may look-up an indication of the deselection driver 242 in a memory, such as through use of a query of a database, and/or perform address arithmetic, to determine which deselection driver 242 corresponds to the physical address of the memory cell 102A (e.g., is located closest to the physical address of the memory call). The database may have been populated at a time of manufacturing of the memory 100 and/or adjusted during operation of the memory 100 to reflect current logical-to-physical address assignments.

At block 266, the control circuit 122 may use the physical address to determine a first of the delivery drivers 244 and a second of the delivery drivers 244 to use to select the memory cell 102A. The location of the memory cell 102A may be indicated by the physical address. Thus, the control circuit 122 may use the physical address, and thus a location indicated by the physical address, to determine which of the delivery drivers 244 is more suitable to use when selecting the memory cell 102. The control circuit 122 may leverage physical distances between the memory cells 102 and the delivery drivers 244 to minimize an impact that activation of the delivery drivers 244 initially has on the memory cells (e.g., to reduce current spikes). Furthermore, each of the memory cells 102 may correspond to two delivery drivers 244 for its corresponding of the bitlines 104 and two delivery drivers 244 for its corresponding of the wordlines 106. In this way, the control circuit 122 may determine the first of the delivery drivers 244 (e.g., one of the two delivery drivers 244A, 244B) as the respective of the delivery drivers 244 disposed furthest to a location of the memory cell 102A and may determine the second of the delivery drivers 244 (e.g., the other of the two delivery drivers 244) to be the respective of the delivery drivers 244 disposed closest to a location of the memory cell 102A. In one example, the first of the delivery drivers 244 may be activated before the second of the delivery drivers 244, and the order of activation may facilitate reduction of current delivery spikes affecting the memory cell 102A (e.g., since a transmission path of relatively higher resistance is used to transmit signals from the first of the delivery drivers 244 as it corresponds to the relatively longer signal transmission path).

After the control circuit 122 determines the deselection driver 242, the first of the delivery drivers 244, and the second of the delivery drivers 244, at block 268, the control circuit 122 may select the memory cell 102A from the memory cells 102 using the determined deselection driver 242. In this way, the control circuit 122 may apply a control signal (TO_GND) to enable the deselection driver 242.

While the memory cell 102A is selected disabling the deselection driver 242, the control circuit 122, at block 270, may activate the first of the delivery drivers 244 deemed to be disposed at a physical location farther from the memory cell 102A than the other of the delivery drivers 244. For example, the control circuit 122 may determine that the memory cell 102A is farther from the delivery driver 244A than the delivery driver 244B, and thus use the delivery driver 244A to facilitate selection of the memory cell 102A. The control circuit 122 may also cause the delivery driver 244A to apply pull-up signals and/or pull-down signals to the memory cell 102A, such as based on determining whether the memory cell 102A is accessed as part of a read operation, a logical high value (e.g., 1) write operation, a logical low value (e.g., 0) write operation, or the like. In this way, the control circuit 122 may activate the transistor 246, the transistor 248, or both, when selecting the memory cell 102A.

While the memory cell 102A is selected disabling the deselection driver 242 and while signals from the first of the delivery drivers 244 are applied to the memory cell 102A, the control circuit 122, at block 272, may activate the second of the delivery drivers 244 deemed to be disposed closer to the memory cell 102A. For example, the control circuit 122 may determine that the memory cell 102A physically located farther from the delivery driver 244A than the delivery driver 244B, and thus use the delivery driver 244B to provide additional driving signals to the memory cell 102A after signals from the delivery driver 244A are applied to the memory cell 102A. This may help deliver a signal (e.g., suitable current signal and/or voltage) suitable for setting a value of the memory cell 102A and/or for reading a value of the memory cell 102A. The signal delivered by the delivery driver 244B and the delivery driver 244A may be a current amount twice of what one of the delivery drivers 244 may individually provide to one of the memory cells 102. The control circuit 122 may also cause the delivery driver 244B to apply pull-up signals and/or pull-down signals to the memory cell 102A, such as based on a determination of whether the memory cell 102A is accessed as part of a read operation, a logical high value write operation, a logical low value write operation, or the like.

Figure 8:
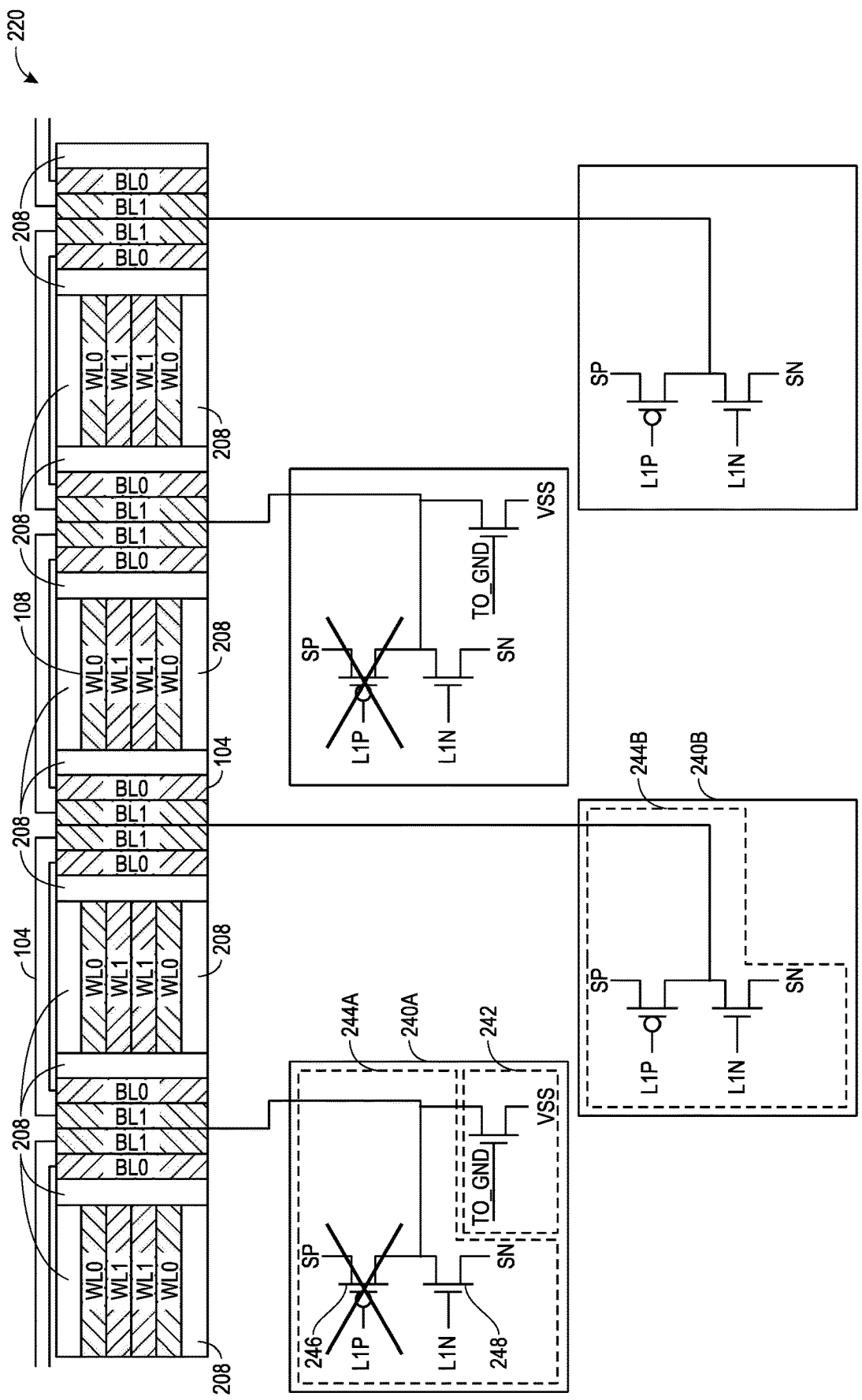
FIG. 8 is a diagram of the driving circuitry of FIG. 6 used to support the dual terminating bitlines and/or wordlines of FIGS. 4 and 5, in accordance with an embodiment.

In some cases, circuitry of the delivery drivers 244 may be simplified based on expected current spikes. FIG. 8 is an illustration of driving circuitry 280 (e.g., 280A and 280B) associated with dual decoder driving discussed above. Some of the decoding circuitry 220 of FIG. 4 is depicted in FIG. 8. In this example, a current spike delivered to the memory cells 102 when selection operations are ongoing may be associated with energy and/or signals provided to the memory cells 102 at a last completed selection operation. For example, whether a last applied voltage and/or current to the memory cell 102A was a negative value (e.g., pull-down operation) or a positive value (e.g., pull-up operation) may affect a current spike applied to the memory cell 102A. Thus, if the control circuit 122 determines a last polarity of signal applied to the memory cell 102A, the control circuit 122 may change which combination of the transistors 246, 248 are enabled to select the memory cell 102A. For example, when the control circuit 122 determines that the last polarity applied to the memory cell 102A was positive, the control circuit 122 may remove (e.g., not enable) the transistors 246 associated with pulling-up voltages of the memory cell 102A to reduce an amount of positive signal applied to the memory cell 102A, thereby compensating for at least some of an anticipated current spike. Furthermore, in some cases, it may be determined during manufacturing that the memory 100 and/or portions of the memory 100 trend toward experiencing a relatively higher number of positive current spikes (or negative current spikes). In these cases, portions of the delivery drivers 244 may be removed to compensate for delivery trends. For example, a subset of the transistors 248 associated with pull-down operations may be removed in portions of the memory 100 that receive relatively higher amounts of negative currents during selection operations. The same may be applied interchangeably for the transistors 246 and the transistors 248. In this way, when relatively higher amounts of positive currents are received by a portion of memory 100, a quantity of the transistors 246 in the portion of the memory 100 may be reduced.

Figure 9:
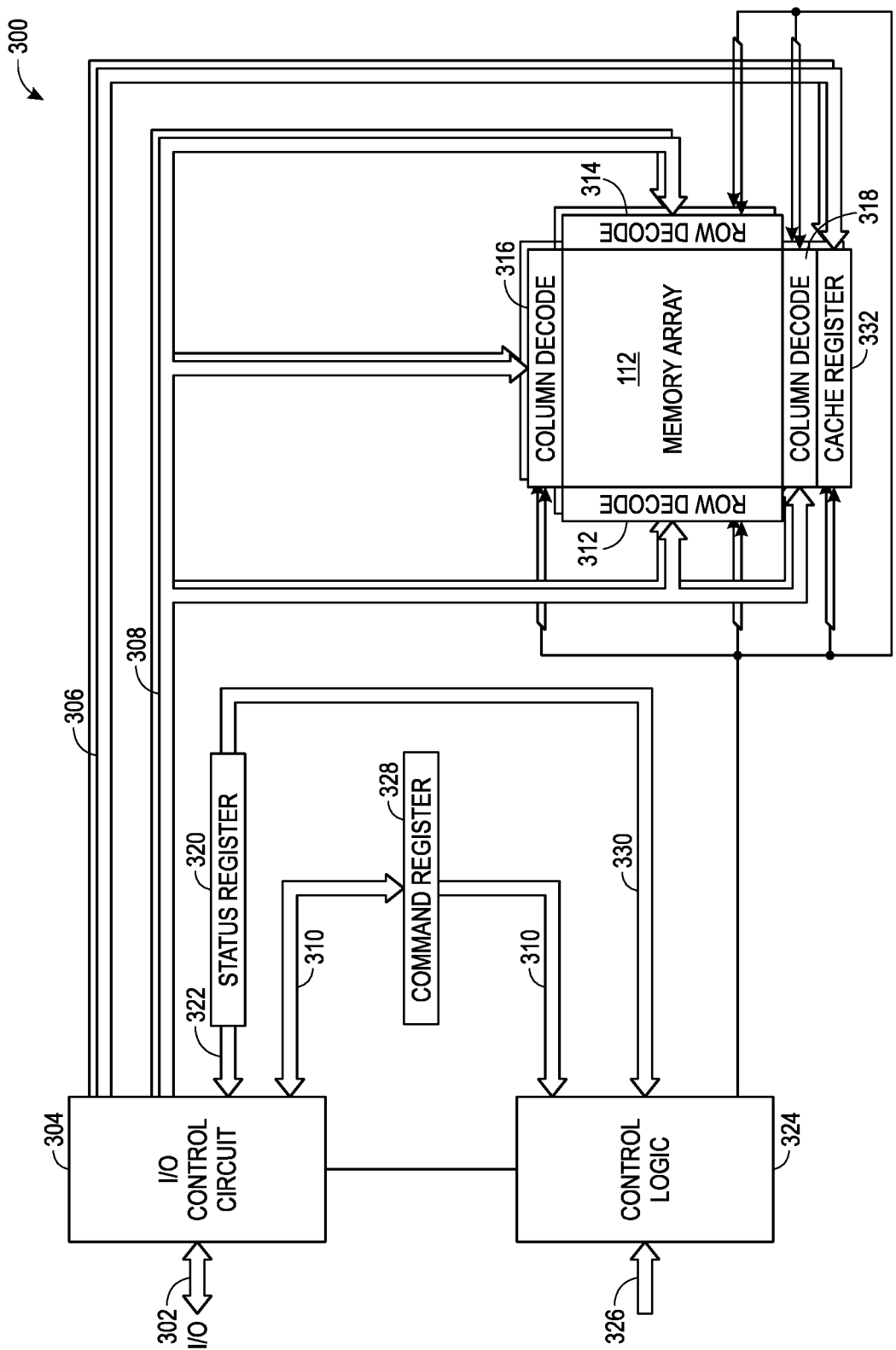
FIG. 9 is a block diagram of a memory device that may include the memory array of FIG. 2, in accordance with an embodiment.

Keeping the foregoing in mind, FIG. 9 is a block diagram of a memory system, such as a memory device 300, that includes the memory array 112 with a plurality of memory cells (e.g., memory cells 102) that may store data. The memory cells may be accessed in the array through the use of various access lines (e.g., wordlines 106, bitlines 104). The memory cells may be non-volatile memory cells, such as NAND or NOR flash cells, phase-change memory cells, 3D XPoint™ memory cells, any suitable threshold-type memory cells, or the like. The memory cells of the memory array 112 may be arranged in a memory array architecture. For example, the memory cells may be arranged in a 3D cross-point architecture, a single-level cross-point architecture, or in any suitable architecture. The memory cells may be single-level cells and/or multi-level cells that store data for one or more bits of data.

A data strobe signal (DQS signal) may be transmitted through a data strobe bus (not shown). The DQS signal may be used to provide timing information for the transfer of data to the memory device 300 or from the memory device 300. An input/output (I/O) bus 302 may couple to an I/O control circuit 304 that routes data signals, address information signals, and other signals between the I/O bus 302 and an internal data bus 306, an internal address bus 308, and/or an internal command bus 310. The I/O control circuit 304 may provide the internal address bus 308 address information. The internal address bus 308 may provide block-row address signals to row decoders 312 and 314, and column address signals to column decoders 316 and 318. The memory device 300 may use the row decoders 312, 314, and column decoders 316, 318 when selecting one or more memory cells for memory operations, such as read and write operations and/or refreshing operations. The row decoders 312, 314, and/or the column decoders 316, 318 may include one or more signal line drivers (e.g., delivery drivers 244, deselection drivers 242) that provide a biasing signal to one or more of the signal lines in the memory array 112. The I/O control circuit 304 may couple to a status register 320 through a status register bus 322. The I/O control circuit 304 may provide status bits stored by the status register 320 in response to a read status command provided to the memory device 300. The status bits may have respective values to indicate a status condition of various aspects of the memory device 300 and its operation.

The memory device 300 may also include a control logic 324 that receives a number of control signals 326 either externally or through the internal command bus 310 to control the operation of the memory device 300. The control signals 326 may be employed with any appropriate interface protocol. For example, the control signals 326 may be pin-based, as is common in dynamic random access memory and flash memory (e.g., NAND flash), operational-code based (op-code based), or the like. Example control signals 326 may include clock signals, read/write signals, clock enable signals, or the like. A command register 328 may be coupled to the internal command bus 310 to store information received from the I/O control circuit 304 and to provide the information to the control logic 324. The control logic 324 may further access the status register 320 through the status register bus 330, such as to update the status bits as status conditions change. The control logic 324 may provide internal control signals to various circuits of the memory device 300.

For example, in response to receiving a memory access command (e.g., read, write, refresh), the control logic 324 may provide internal control signals to control various memory access circuits to perform a memory access operation. In particular, the control logic 324 may determine a relative location of one or more target memory cells of the memory array 112 to respective decoder circuits included in the row decoders 312, 314, and/or the column decoders 316, 318. The determination of the relative distance between the one or more target memory cells and their respective pairs of decoder circuits may determine a sequence the decoder circuits of the respective pairs of decoder circuits are activated when accessing the one or more target memory cells. Based on the determination, the control logic 324 may provide control signals to the row decoders 312, 314 and/or the column decoders 316, 318 so that the decoder circuits are activated in a desired sequence. Additionally, the control logic 324 may include a control circuit, such as the control circuit 122 of FIG. 1, which may provide the control signals in the desired sequence. The various memory access circuits may be used during the memory access operation, and may generally include circuits such as row and column decoders, charge pump circuits, signal line drivers, data and cache registers, I/O circuits, as well as other circuitry.

An example sequence for accessing one or more target memory cells of the memory array 112 may follow the example process 260 of FIG. 7. For example, based on a memory address of a target of the memory cells 102, the control logic 324 may determine which of respective pairs of decoder circuits are farther away from and closer to the target memory cell. This information may be provided to the control circuit, such that the decoder circuits farther away of the respective pairs of decoder circuits are activated (e.g., such that delivery drivers 244 are activated in suitable sequence while deselection drivers 242 are activated) before the decoder circuit closer to the target memory cell of the respective pair of the decoder circuits. By sequentially activating the respective decoders of the pair of decoder circuits to access the target memory cell, a potential current spike that may result if the target memory cell thresholds may be reduced or eliminated.

A cache register 332 (e.g., a data I/O circuit) may include one or more circuits that facilitate data transfer between the I/O control circuit 304 and the memory array 112 based on signals received from the control logic 324. In some cases, the cache register 332 may include one or more registers, buffers, and/or other circuits for managing data transfer between the memory array 112 and the I/O control circuit 304. For example, during a write operation, the I/O control circuit 304 may receive the data to be written through the I/O bus 302 and may provide the data to the cache register 332 via the internal data bus 306. The cache register 332 may write the data to the memory array 112 based on control signals provided by the control logic 324 at a location specified by the row decoders 312, 314 and the column decoders 316, 318. During a read operation, the cache register 332 may read data from the memory array 112 based on control signals provided by the control logic 324 at an address specified by the row decoders 312, 314 and column decoders 316, 318. The cache register 332 may provide the read data to the I/O control circuit 304 via the internal data bus 306. The I/O control circuit 304 may then provide the read data on the I/O bus 302.

Thus, technical effects of the current disclosure may include improvements to signal delivery to memory cells when selection operations are performed to select one or more memory cells of a memory array. As discussed above, drivers of the memory array may include circuitry separately selectable, such as a selector driver and a delivery driver. Each delivery driver may include a driving transistor that enables pull-up signals (e.g., positive voltages, positive currents) to be applied to the memory cells and/or a driving transistor that enables pull-down signals (e.g., negative voltages, negative currents) to be applied to the memory cells. A control circuit may activate the selector driver before the delivery drivers when using bitlines that are dually terminated. The control circuit may then activate the delivery driver determined to be relatively farther from the memory cell while the selector driver is activated. The control circuit may then activate the delivery driver determined to be relatively closer to the memory cell while the other delivery driver and the selector drivers are activated. In some cases, to select a memory cell, delivery drivers associated with a bitline for the memory cell may be activated at least simultaneous to delivery drivers associated with a wordline for the memory cell. The control circuit may incrementally provide selection signals to the memory cells to reduce a likelihood or an amplitude of a current spike being delivered to one or more targeted memory cells.

Furthermore, the control circuit may, in some cases, selectively activate the delivery drivers based on one or more previously applied selection signals as a way to help reduce a likelihood of amplitude of a current spike delivered to one or more of the targeted memory cells. In addition, portions of the memory that may trend to receiving a current spike of a particular polarity during selection operations may have delivery drivers of the particular polarity removed from some of the portion of the memory, such as at a time of manufacturing, to help reduce a likelihood of amplitude of a current spike delivered to one or more of the targeted memory cells.

With these technical effects in mind, multiple memory devices may be included on a memory module, thereby enabling the memory devices to be communicatively coupled to the processing circuitry as a unit. For example, a dual in-line memory module (DIMM) may include a printed circuit board (PCB) and multiple memory devices. Memory modules respond to commands from a memory controller communicatively coupled to a client device or a host device via a communication network. Or in some cases, a memory controller may be used on the host-side of a memory-host interface; for example, a processor, microcontroller, field programmable gate array (FPGA), application-specific integrated circuit (ASIC), or the like may each include a memory controller. This communication network may enable data communication there between and, thus, the client device to utilize hardware resources accessible through the memory controller. Based at least in part on user input to the client device, processing circuitry of the memory controller may perform one or more operations to facilitate the retrieval or transmission of data between the client device and the memory devices. Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory controller operations and memory writing operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
   a memory array comprising a target memory cell disposed at a location defined by a memory address;
   an access line configured to form at least a portion of the target memory cell;
   a first decoder associated with a first delivery driver, wherein the first decoder is coupled to a first end of the access line;
   a second decoder associated with a second delivery driver, wherein the second decoder is coupled to a second end of the access line; and
   a control circuit configured to perform operations comprising:
      determining a polarity of a signal delivered to the target memory cell as part of a previous selection operation; and
      performing a current selection operation based on the polarity of the signal.

2. The apparatus of claim 1, wherein the operations comprise:
   determining that the second delivery driver is disposed closer to the location defined by the memory address than the first delivery driver;
   in response to determining that the second delivery driver is disposed closer to the location defined by the memory address, activating the first delivery driver before the second delivery driver; and
   activating the second delivery driver to select the target memory cell for use in a memory operation.

3. The apparatus of claim 1, wherein the first decoder is associated with a selector driver, and wherein the control circuit is configured to activate the selector driver before activating either of the first delivery driver or the second delivery driver.

4. The apparatus of claim 1, wherein the access line is configured to form at least the portion of the target memory cell at least in part by being disposed in a plane above a plane in which the target memory cell is formed in.

5. The apparatus of claim 4, wherein the target memory cell is formed at least in part from a selection device material disposed between a wordline contact and a bitline contact, wherein the access line comprises one of the wordline contact or the bitline contact.

6. The apparatus of claim 1, wherein the memory array comprises at least one of phase-change memory, 3D XPoint™ memory, or any combination thereof.

7. The apparatus of claim 1, wherein the operations comprise activating a third delivery driver and a fourth delivery driver while activating the first delivery driver and the second delivery driver.

8. The apparatus of claim 7, wherein the third delivery driver and the fourth delivery driver both correspond to a wordline associated with the target memory cell, and wherein the access line corresponds to a bitline associated with the target memory cell.

9. The apparatus of claim 7, wherein the third delivery driver and the fourth delivery driver both correspond to an additional target memory cell.

10. The apparatus of claim 1,
    wherein the first decoder comprises a third delivery driver associated with a first polarity of output, wherein the first delivery driver is associated with a second polarity of output, and wherein the operations comprise determining not to activate the third delivery driver based at least in part on the polarity of the signal delivered to the target memory cell as part of the previous selection operation.

11. A method for operating a control circuit, comprising:
    receiving a command to instruct the control circuit to select a memory cell, wherein the memory cell is defined between a bitline and a wordline, wherein each of the bitline and the wordline are configured to terminate at different decoders, wherein a first bipolar decoder comprises a first delivery driver, and a second bipolar decoder comprises a second delivery driver;
    determining that the first delivery driver is disposed farther from the memory cell than the second delivery driver;
    determining a polarity of a signal delivered to the memory cell as part of a previous selection operation;
    in response to determining that the first delivery driver is disposed farther from the memory cell, activating the first delivery driver before the second delivery driver, wherein activating the first delivery driver involves turning on one or more transistors of the first delivery driver based on the polarity of the signal delivered to memory cell as part of the previous selection operation; and
    activating the second delivery driver while the first delivery driver is activated to select the memory cell for use in a memory operation.

12. The method of claim 11, wherein determining that the first delivery driver is disposed farther from the memory cell than the second delivery driver comprises determining that the first delivery driver is disposed relatively farther from a memory address of the memory cell than the second delivery driver.

13. The method of claim 11, comprising activating a selector driver before activating either of the first delivery driver or the second delivery driver, wherein the memory cell is associated with the selector driver, and wherein the first bipolar decoder comprises the selector driver and the first delivery driver.

14. The method of claim 13, comprising delivering a selection signal to turn on a selector element of the memory cell, wherein the selector element changing state is configured to cause the memory cell to be used in the memory operation.

15. The method of claim 11, comprising determining not to activate a third delivery driver based at least in part on the polarity of the signal delivered to the memory cell as part of the previous selection operation, wherein the first bipolar decoder comprises the third delivery driver associated with a first polarity of output, and wherein the first delivery driver is associated with a second polarity of output.

16. A semiconductor device, comprising:
   a memory cell corresponding to a memory address, wherein the memory address defines a physical location of the memory cell within a three-dimensional memory array comprising a plurality of memory cells;
   a first decoder comprising a first driver and a second driver;
   a second decoder comprising a third driver;
   an access line associated with the memory cell, wherein the access line is configured to terminate a first end at the first decoder, and wherein the access line is configured to terminate a second end at the second decoder; and
   a control circuit coupled to the first decoder and the second decoder, wherein the control circuit is configured to perform operations comprising:
      determining that the first decoder is disposed farther from the memory cell than the second decoder;
      determining a polarity of a signal delivered to the memory cell as part of a previous selection operation;
      in response to determining that the first decoder is disposed farther from the memory cell, activating the first driver before the second driver, wherein activating the first driver involves turning on one or more transistors of the first driver based on the polarity of the signal delivered to the memory cell as part of the previous selection operation; and
      activating the third driver to select the memory cell for use in a memory operation.

17. The semiconductor device of claim 16, wherein the memory cell is defined between the access line and an additional access line.

18. The semiconductor device of claim 16, wherein the memory cell comprises a material layer configured as a selector element layer and as a memory element layer.

19. The semiconductor device of claim 16, comprising a third decoder, wherein the first decoder and the second decoder are associated with a first deck of the three-dimensional memory array, wherein the third decoder is associated with a second deck of the three-dimensional memory array, and wherein the first decoder is disposed adjacent to the third decoder on a socket.

20. The semiconductor device of claim 16, wherein the operations comprise activating the second driver before activating the third driver.

* * * * *

UNITED STATES PATENT AND TRADEMARK OFFICE
CERTIFICATE OF CORRECTION

PATENT NO. : 11,139,023 B1
APPLICATION NO. : 16/824104
DATED : October 5, 2021
INVENTOR(S) : Pellizzer et al.

It is certified that error appears in the above-identified patent and that said Letters Patent is hereby corrected as shown below:

In the Specification

IN THE DETAILED DESCRIPTION:
Column 12, Line 22, please replace --call-- with "cell".
Column 16, Line 27, please replace --or-- with "of".
Column 16, Line 32, please insert --an-- before "amplitude".

Signed and Sealed this
Twenty-seventh Day of September, 2022

Katherine Kelly Vidal
*Director of the United States Patent and Trademark Office*